(12) United States Patent
Campbell et al.

(10) Patent No.: US 7,677,180 B2
(45) Date of Patent: Mar. 16, 2010

(54) APPARATUS AND METHOD FOR STEERING TRANSPORT VEHICLES IN SEMICONDUCTOR PROCESSING

(75) Inventors: Philip L. Campbell, Millbrook, NY (US); Uldis A. Ziemins, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 514 days.

(21) Appl. No.: 11/160,111

(22) Filed: Jun. 9, 2005

(65) Prior Publication Data

US 2006/0278120 A1 Dec. 14, 2006

(51) Int. Cl.
*B60L 13/04* (2006.01)
(52) U.S. Cl. ...................................... 104/281
(58) Field of Classification Search ................. 104/281, 104/282, 284, 286, 287
See application file for complete search history.

(56) References Cited

U.S. PATENT DOCUMENTS

| 4,882,999 | A | * | 11/1989 | Azukizawa et al. | 104/281 |
| 5,170,715 | A | * | 12/1992 | Gran et al. | 104/284 |
| 5,517,924 | A | * | 5/1996 | He et al. | 104/286 |
| 5,666,883 | A | * | 9/1997 | Kuznetsov | 104/281 |
| 5,904,101 | A | * | 5/1999 | Kuznetsov | 104/281 |

FOREIGN PATENT DOCUMENTS

| JP | 4117111 A | 4/1992 |
| JP | 4117112 A | 4/1992 |
| JP | 4125007 A | 4/1992 |
| JP | 4217802 A | 8/1992 |
| JP | 8163712 A | 6/1996 |

OTHER PUBLICATIONS

D.L. Miller, "Frictionless Bearing Support for Vacuum Transport", IBM TDB Jan. 1977 p. 2839.

* cited by examiner

*Primary Examiner*—S. Joseph Morano
*Assistant Examiner*—Robert J McCarry, Jr.
(74) *Attorney, Agent, or Firm*—DeLio & Peterson, LLC; Robert Curcio

(57) ABSTRACT

A steering apparatus and method is implemented that allows high speed, clean, particle-free transport of a semiconductor wafer or lithographic reticle on a transport vehicle at various positions on the vehicle track, especially when entering and exiting turns. Three computer-controlled electro-magnets are mounted at the left, center, and right side of a front steering truck, and are energized to attract strategically placed permanent magnet material mounted on a side of the track where the vehicle enters or exits a turn. The transport vehicle can be levitated by an air cushion or travel on wheels, and controlled by electromotive or electromagnetic forces about the track. Using the steering electro-magnets as a LVDT, a computer processor monitors the location of the transport vehicle about the track.

17 Claims, 6 Drawing Sheets

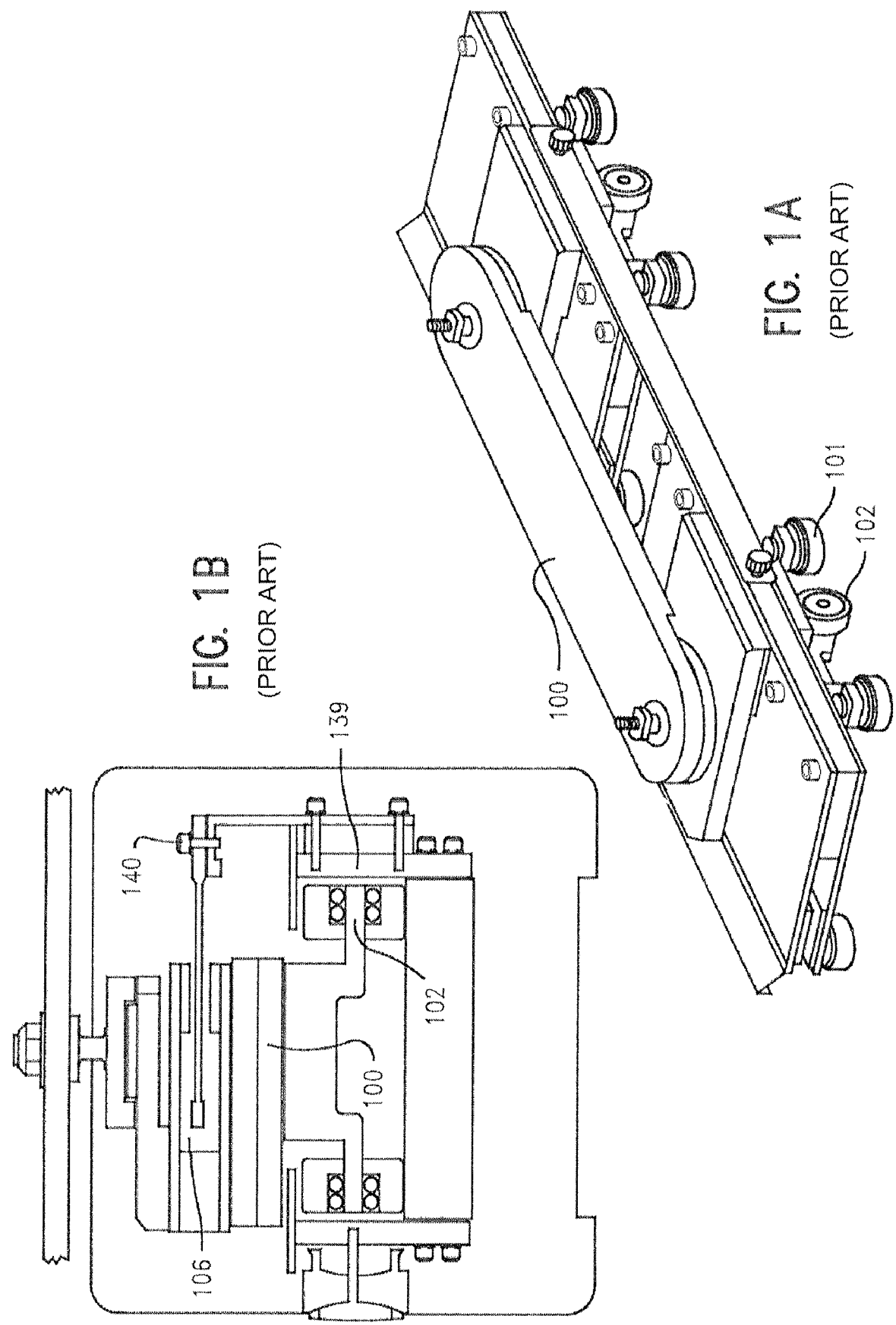

FIG. 4B  TYPICAL MACRO TRACK LAYOUT

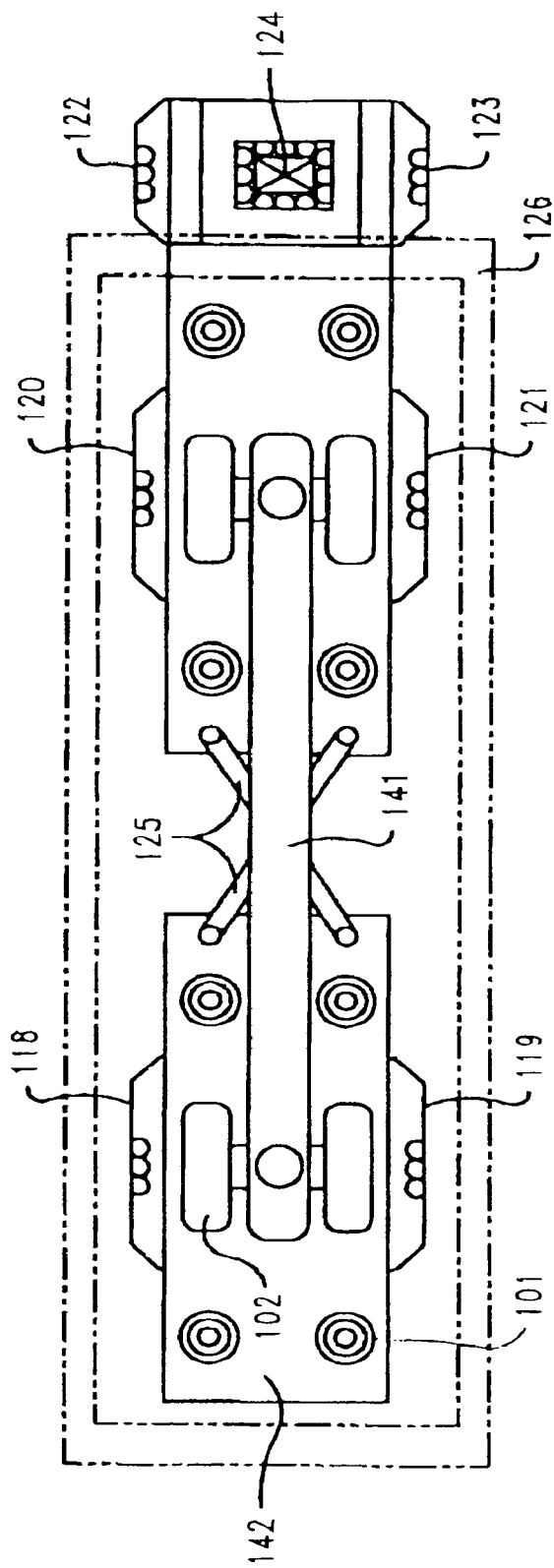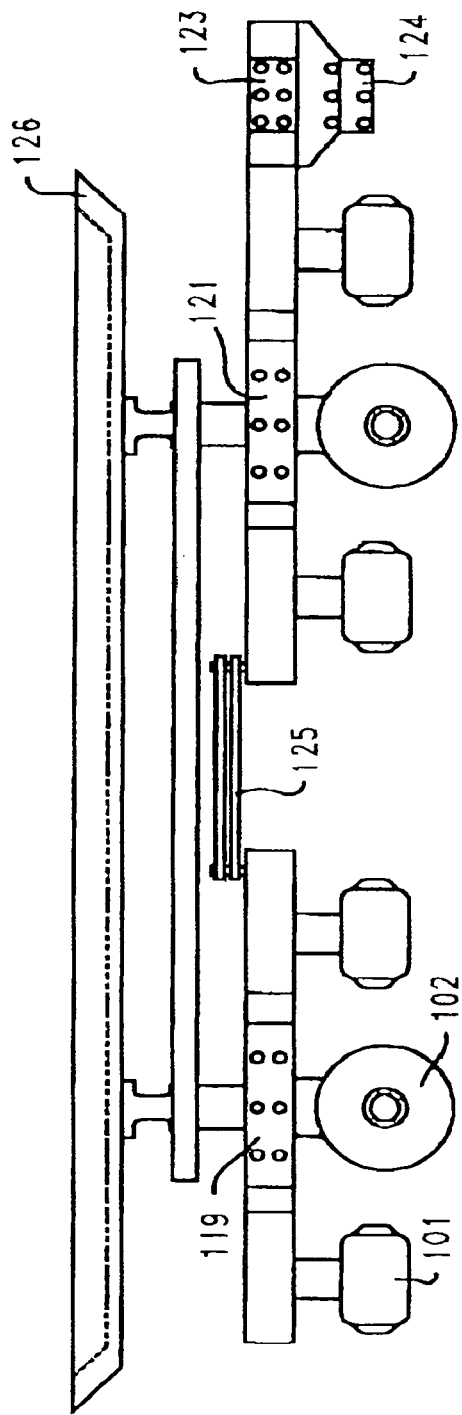
FIG. 5A
FIG. 5B

APPARATUS AND METHOD FOR STEERING TRANSPORT VEHICLES IN SEMICONDUCTOR PROCESSING

BACKGROUND OF THE INVENTION

1. Field of the Invention

This invention relates to semiconductor wafer processing, and more specifically to the steering of a rail-mounted vehicle transporting a semiconductor wafer, lithographic reticles, or liquid crystal flat panel displays, during processing.

2. Description of Related Art

Automated material handling systems (AMHS) are an essential part of a semiconductor chip fabrication process, typically used as the transport mechanism for the carriers that contain semiconductor wafers. In a 300 mm fab these carriers could be a Front Opening Unified Pod (FOUP) or Reticle Storage Pod (RSP). Fast, efficient, and particle free routing of wafer FOUP or RSP transport vehicles is paramount to world-class performance of a semiconductor manufacturing process. Typically, the wafers are transported in a FOUP on top of transport vehicles that run on a track system. The alignment and placement of the FOUP or RSP is governed in part by the steering and control of the transport vehicle. A critical process in transporting FOUPs or RSPs in this system is having the vehicle make turns while the FOUP or RSP is in route. For turning, mechanical systems of the prior art currently in place rely upon a merge/diverge mechanism or lever arm to make a vehicle turn left or right on the track. Similar to a train rail, the lever arm is activated to switch from one track to another when a change in direction of the vehicle is desired. The vehicle turning is performed using such levers, bars, or rollers that affect a slow transition for turns. However, the mechanics used to make these turns put contacting surfaces under frictional stress, which generate particles that contribute foreign material (FM) contamination to a clean room environment which can be correlated to yield loss in the semiconductor manufacturing process. Current overhead transport vehicles include those taught by Daifuku, Murata, Shinko, and Brooks-PRI.

In a series of Japanese patents related to magnetic conveyors, patent no. JP08-163712 issued to Furukawa Shohei, entitled "MAGNETICALLY LEVITATED CONVEYOR," patent no. JP04-217802 issued to Yoneda Tadao, et al., entitled "MAGNETIC LEVITATION CARRIER," and patent no. JP04-125007 issued to Murato Masanao, et al., entitled "MAGNETICALLY LEVITATED CONVEYOR," methods of steering semiconductor transport vehicles including stabilization and control have been achieved by electro-magnetically levitating the transport vehicle from the track. Tadao teaches using electro-magnets and guide cap sensors disposed at four points in the front and rear of a vehicle or slider that levitates the vehicle magnetically along guide rails. Shohei teaches mounting a levitation electro-magnet at the truck to magnetically attract a rail at the linear part of a conveying passage. A guide electro-magnet provided on the truck magnetically attracts guide rails provided along both sides of a curved portion of the track.

All of these inventions provide electromagnetic levitation to lift the transport vehicle. However, in each instance the vehicle is levitated and transported on a center rail, which acts as the directional guide for the vehicle. Electro-magnets have not been used in the prior art to initiate and negotiate turns. These series of patents, however, do not teach using electro-magnets for steering and controlling, rather than levitation, or suggest suspending and driving the transport vehicle with an air cushion, or having the transport vehicle supported by wheels and controlled by electro-magnets for selecting the proper vehicle path.

Due to inertial forces and magnetic levitation, electromagnets can be used in various configurations to control the uniform travel of a transport vehicle within a curve or straight section of track. In order for the vehicle to ride uniformly in a cross-direction or tilt in the curves and straight sections, various combinations of electromagnets must be deployed.

FIG. 1A depicts a prior art transport vehicle 100 that travels on wheels 102 and is guided down the track by guide wheels or rollers 101. This design is similar to the one taught by Murata. FIG. 1B depicts the undercarriage of the transport vehicle 100 of FIG. 1A. The vehicle is propelled by a linear magnet stepper motor 140 and a magnet propulsion motor 106, to guide it down a track 139. FIG. 1C details the physical relationship between the main support wheels 102, the guide wheels or rollers 101, and the linear magnet propulsion motor 106.

The prior art uses a merge/diverge system, as depicted in FIGS. 2 and 3, to steer and direct the transport vehicle 100. For illustrative purposes, the straight section of track 103 shown in FIG. 2 leads into another straight section 106. A left turn track portion 107 is attached at the junction of straight sections 103 and 106. When the computer controller of the track transport system determines that vehicle 100 should be going in a straight direction on section 103 to section 106, the merge/diverge lever 104 is moved to position 104. If the vehicle is required to turn to the left on track section 107, the merge/diverge lever 104 is moved to position 105, as shown in FIG. 3. This is a slow transition from one designated position to another, requiring movement of discrete parts with potential for mechanical failure. Moreover, the motion and frictional wear generates airborne contaminating particles. Additionally, when the vehicle guide rollers/wheels 101 traverse a merge/diverge lever, the vehicle experiences a significant amount of vibration.

The known solutions degrade the performance of existing vehicles because the vehicles must slow down when approaching and entering a turn. The turning action forces the steering rollers to ride along a guide rail switch lever, which in turn creates friction and results in particle contamination. The movement on the prior art control rails, similar to a train track switch, is slow and prone to mechanical failure.

SUMMARY OF THE INVENTION

Bearing in mind the problems and deficiencies of the prior art, it is therefore an object of the present invention to provide an apparatus and method for implementing a non-invasive steering mechanism for a rail mounted transport vehicle for use in semiconductor wafer processing.

It is another object of the present invention to provide a method and apparatus for non-contact steering and controlling a transport vehicle capable of allowing the vehicle to make high speed turns without contacting track levers, rollers, switch tracks, turntables, or shunts.

A further object of the invention is to provide an apparatus and method for locating a transport vehicle on a rail during semiconductor wafer processing.

It is yet another object of the present invention to provide an apparatus and method for steering a transport vehicle used in semiconductor processing that reacts quickly without generating particulate contaminants.

Still other objects and advantages of the invention will in part be obvious and will in part be apparent from the specification.

The above and other objects, which will be apparent to those skilled in art, are achieved in the present invention, which is directed to in a first aspect an apparatus for transporting a semiconductor wafer or lithographic reticles during processing, comprising: a plurality of track sections forming different routes within a process area, the routes including attachable turn sections, junction sections, and straight sections; a transport vehicle including a front steering truck adapted to travel on the plurality of track sections; a plurality of computer controlled electro-magnets mounted on the front steering truck, the electro-magnets activated by the computer to propel the transport vehicle, initiate turns on the collection of track sections, and locate the vehicle; and a plurality of permanent magnets mounted on the track sections, responsive to the electro-magnets when activated for steering the transport vehicle, such that the vehicle merges or diverges from one track section to another track section without coming in contact with a side of the track section.

In a second aspect, the present invention is directed to a method of steering a transport vehicle during semiconductor wafer or lithographic reticle processing, the method comprising: propelling the transport vehicle over a plurality of track sections in a processing area; steering the transport vehicle using electro-magnets in electromagnetic communication with permanent magnets; and activating the electro-magnets using a computer processor, such that signals from the computer processor control the transport vehicle direction.

In a third aspect, the present invention is directed to a method of steering a transport vehicle during semiconductor wafer processing, the method comprising: monitoring the transport vehicle location with a computer processor; propelling the transport vehicle on a plurality of tracks; and determining when the transport vehicle should alter direction and activating electro-magnets on the transport vehicle to change direction, the electro-magnets in electromagnetic communication with permanent magnets on the tracks.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1A depicts a prior art transport vehicle that travels on wheels and is guided down the track by guide wheels or rollers.

FIG. 1B depicts the undercarriage of the transport vehicle of FIG. 1A.

FIG. 4B is an expanded view of a portion of the factory layout of FIG. 4A.

FIG. 5A depicts the bottom-up view of the vehicle of

DESCRIPTION OF THE PREFERRED EMBODIMENT(S)

In describing the preferred embodiment of the present invention, reference will be made herein to FIGS. 1-6 of the drawings in which like numerals refer to like features of the invention.

This invention involves an apparatus and method for implementing, driving, and locating a transport vehicle on a vehicle track system used to transport semiconductor wafers, lithographic reticles, or liquid crystal flat panel displays, during processing. Using semiconductor wafer processing as an example, but not limiting the application of the invention only to wafer processing, transporting a carrier full of 300 mm semiconductor wafers by hand is not physically feasible due to the ergonomic hazard of high FOUP weight, or economically feasible due to the loss of production efficiency caused operator error associated with multitude of process steps. Consequently, automated computer controlled transportation is required.

The invention implements a steering apparatus and method that allows high speed, clean, particle-free transport at various positions on the vehicle track, especially when entering and exiting turns. Typically, transport vehicles ride on two articulated, mounted wheel trucks, not unlike the wheels of a railroad boxcar, or ride while being levitated electromagnetically off a center rail. In either case, the turning and controlling of the vehicle requires mechanical invasive support, such as using track switches and levers, or using the center rail construction for turns. The non-contact steering mechanism of the present invention uses electro-magnets to control directly the front steering truck of the overhead transport vehicle, not only down straight paths but also to select and initiate turns for the vehicle. Thus, electro-magnets of the present invention are used specifically for turning the transport vehicle, and changing its path across different track sections.

In one preferred embodiment, three computer-controlled electro-magnets are mounted at the left, center, and right side of a front steering truck, and are energized to attract strategically placed permanent magnet material mounted on a side of the track where the vehicle enters or exits a turn. If, for example, the vehicle control system controls the vehicle to turn to the right, the controller energizes the right side magnet, and the steering truck is deflected to the right, thereby steering the vehicle to the right shunt of the track. The same applies in a left turn when the left magnet is energized. If the track splits in three directions, where the truck may traverse right, left or straight, a center magnet is used to keep the vehicle stabilized in the center of the track. These active magnets may be mounted on the track at the turning locations, or mounted in the traveling vehicle. In one embodiment, the transport vehicle has a permanent magnet mounted only on the steering truck.

Figure 1C:
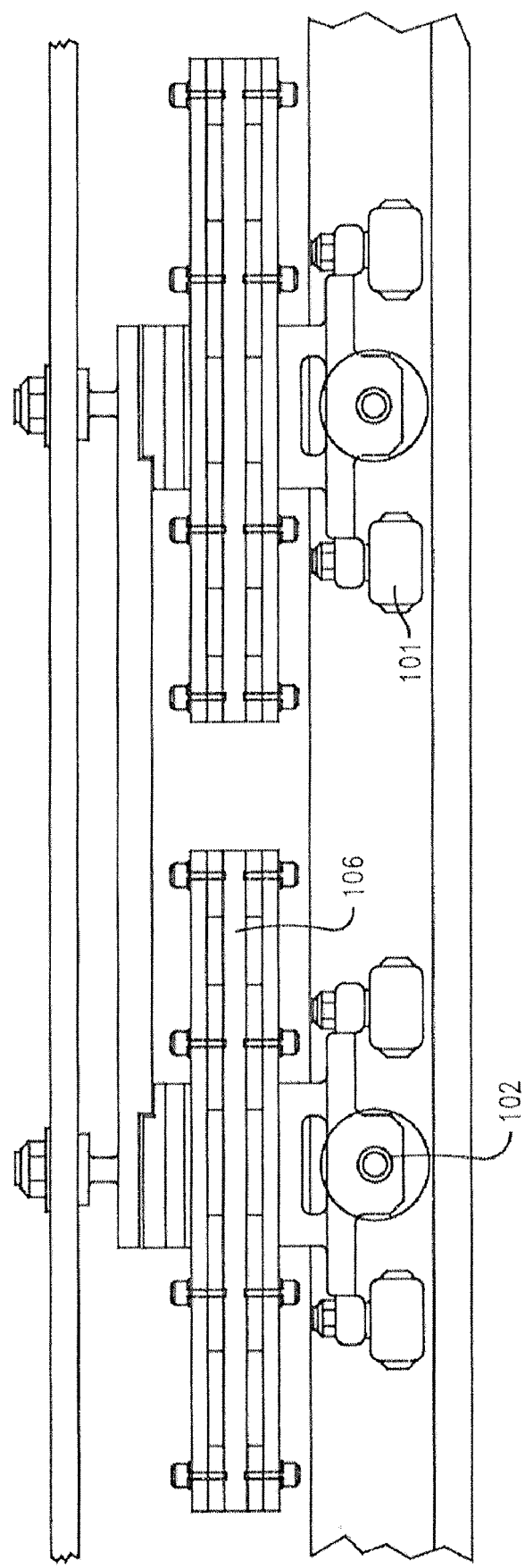
FIG. 1C is a schematic detailing the physical relationship between the main support wheels, the guide wheels or rollers, and the linear magnet propulsion motor of the transport vehicle of FIG. 1A.
Figure 2:
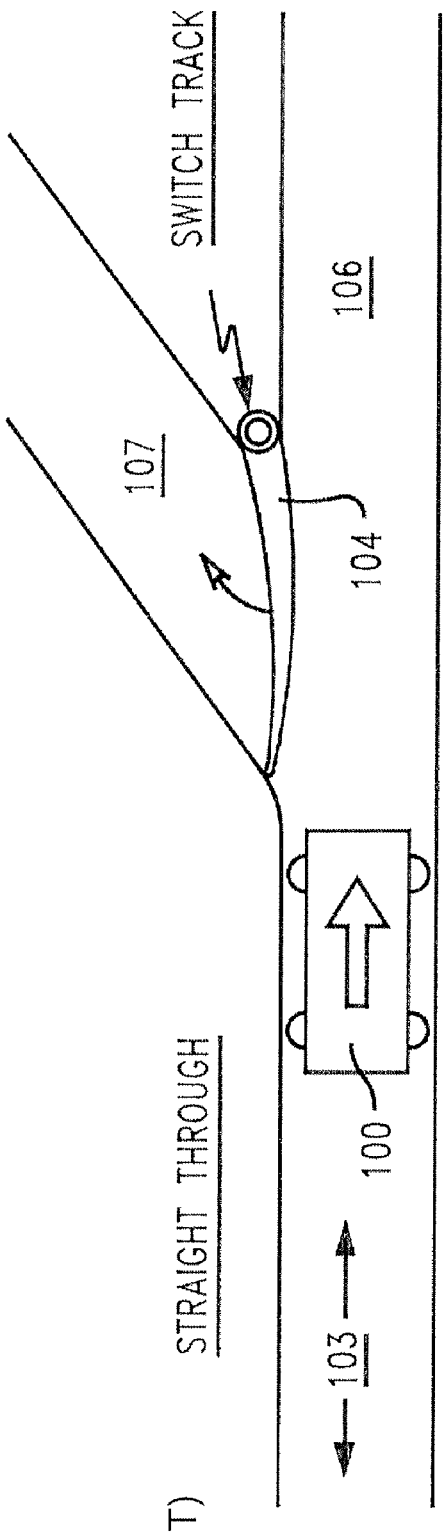
FIG. 2 depicts the merge/diverge system of the prior art used to steer and direct a transport vehicle.
Figure 3:
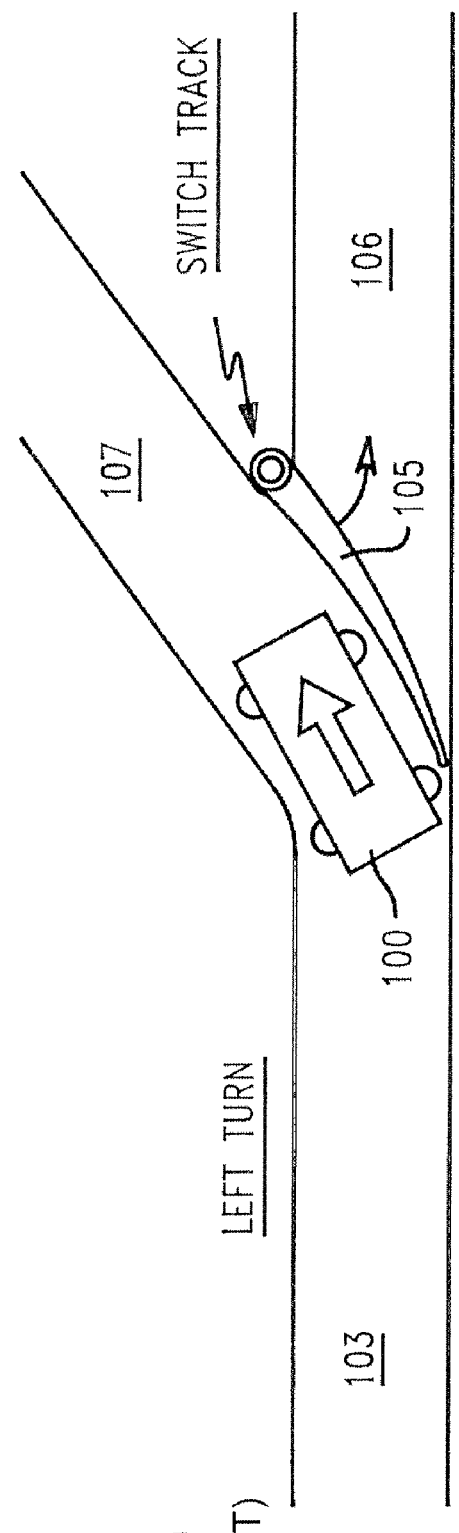
FIG. 3 depicts the merge/diverge lever of FIG. 2, shown moved to a new position to initiate a vehicle turn.
Figure 4A:
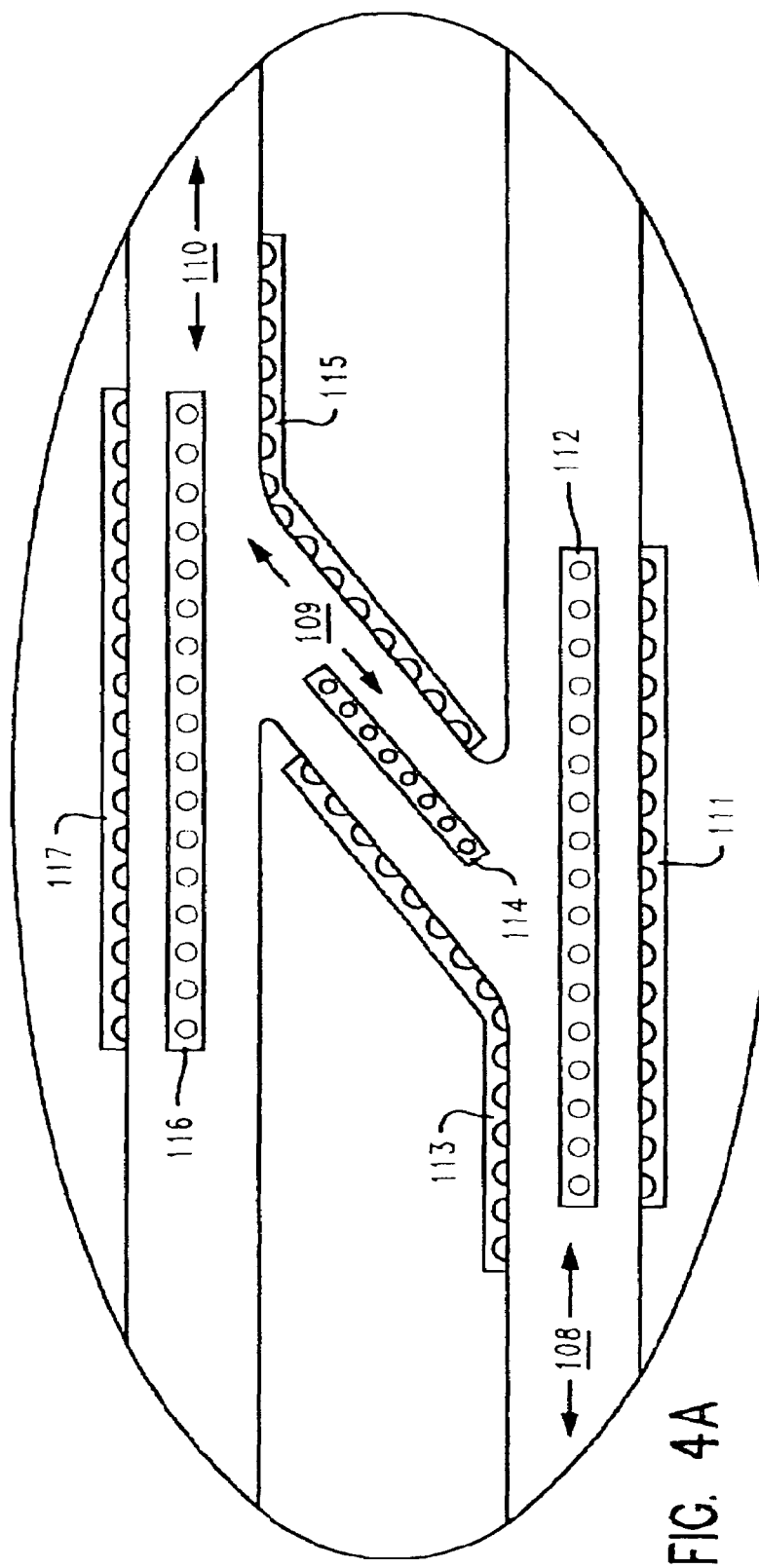
FIG. 4A depicts a macroscopic view of a typical factory layout of the transport track.
Figure 4A:
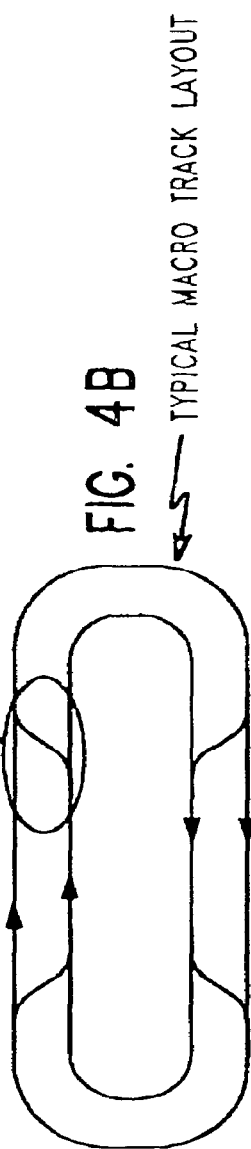
Figure 6:
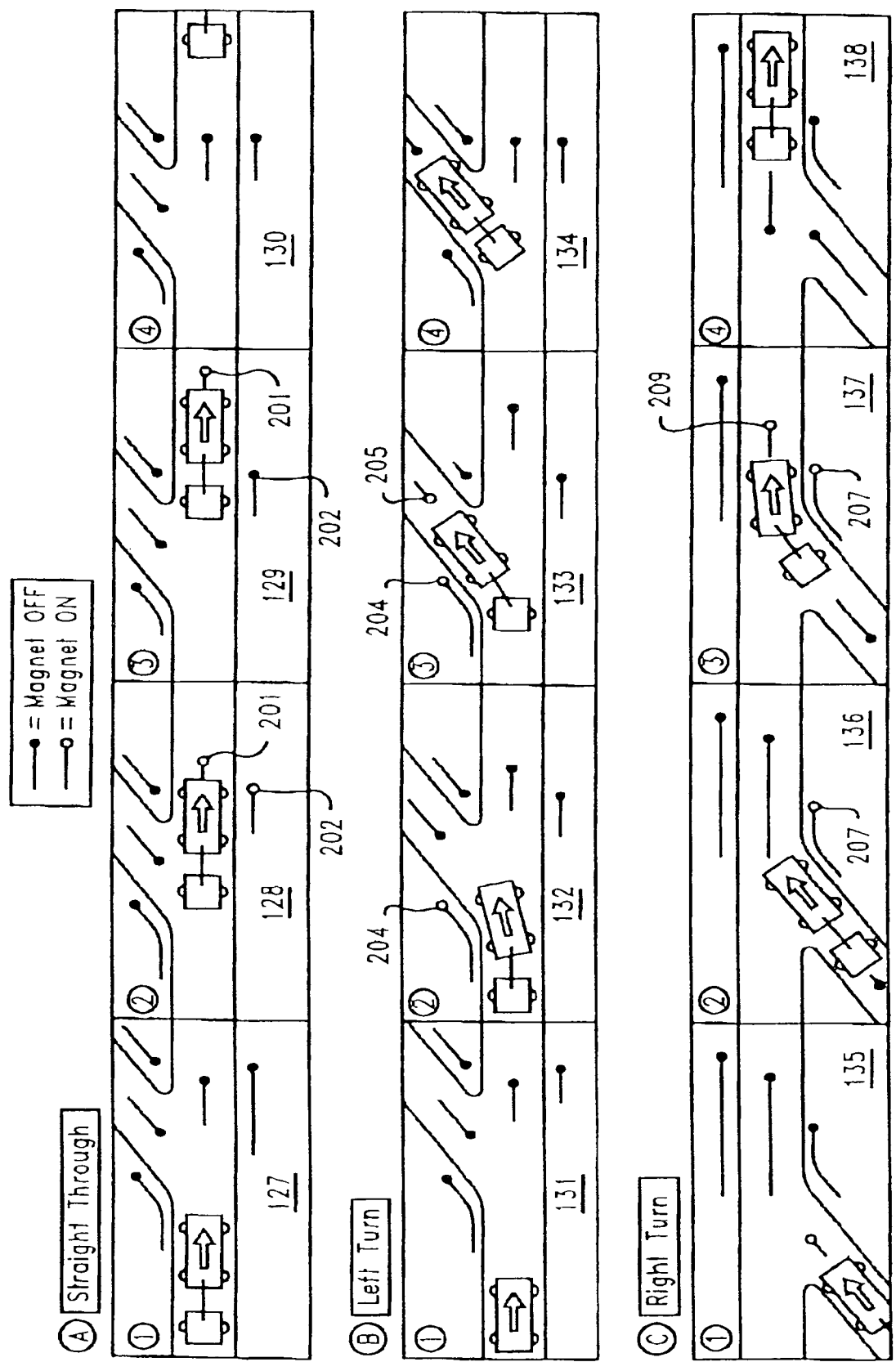
FIGS. 6A-6C depict different scenarios for vehicular travel along with the corresponding energized/de-energized status of the electro-magnets employed to initiate and control the travel.

FIG. 4 depicts a preferred embodiment of the present invention. FIG. 4A depicts a macroscopic view of a typical factory layout of the transport track. A straight track section 108 connects to a second straight track section 110 through a junction track section or turn section 109. Many junction track sections may be present in the track layout. For illustrative purposes, junction track section 109 is expanded to depict the electro-magnet placement of the present invention. FIG. 4B is an expanded view of a portion of the factory layout of FIG. 4A. As shown, the track path is similar to those used in the prior art, but instead of mechanical levers directing guide rollers on the vehicle, the track utilizes electro-magnets to attract a steering magnet on the vehicle, which causes the vehicle to turn.

Electro-magnets 112 and 116 are used to move the vehicle forward, down straight path sections 108 and 110. Electro-magnet 113 is used to turn the vehicle to the left, while electro-magnet 115 turns the vehicle to the right. Electro-magnet 114, located in the center of the junction track 109 is employed to steady the vehicle while transitioning from one straight section to the other through this turn segment. Electro-magnet 111 is used to stabilize the vehicle when electro-magnet 112 is directed the vehicle on the straight path 108. Similarly, electro-magnet 117 stabilizes the vehicle when electro-magnet 116 is directed the vehicle down straight path 110.

FIGS. 5A and 5B depict bottom and side views of the vehicle of the present invention, respectively. In this embodiment, the vehicle retains portions of the prior art designs shown for vehicle 100, for example, it utilizes main support wheels 102 and guide wheels 101. However, electro-magnets 118, 119, 120, 121, 122, 123 and 124 are added to the vehicle trucks 142, 143, as shown. The trucks 142, 143 are linked together by support 141. Cross-links 125 are used to control the articulation of the front and rear trucks as the vehicle negotiates a turn to prevent a jack-knife behavior. The three primary steering magnets on the vehicle are magnet 122 for initiating a left turn, magnet 123 for initiating a right turn, and magnet 124 for maintaining a straight path for the vehicle. Magnets 118 and 120 are used to stabilize the vehicle when making a left turn, and magnets 119 and 121 are used to stabilize the vehicle when making a right turn. These stabilizing magnets allow the vehicle to make turns at higher speeds than if just relying on the turning friction of the main support wheels 102. FIG. 5B depicts a hypothetical payload carrying nest 126 attached to the top of the vehicle.

FIGS. 6A-6C depict different scenarios for vehicular travel along with the corresponding energized/de-energized status of the electro-magnets employed to initiate and control the travel. In FIG. 6A a vehicle is shown traversing down a straight-through path. In frame 128, magnets 201 and 202 on the track are activated or energized to ensure that the vehicle keeps from bearing left. Once the vehicle is past the turning point as shown in frame 129, magnet 202 is de-energized. Magnet 201 is subsequently de-energized as the vehicle continues to traverse the straight track path, frame 130. A processor controller that monitors the timing of the electro-magnet activation operates the electro-magnets. The processor controller also monitors the location of the vehicle through various sensors. One embodiment of the position sensor is to use the steering magnets as a Linear Variable Differential Transformer (LVDT). These sensors may also be embodied as Hall effect sensors, capacitive proximity sensors, infrared beam sensors, various linear encoders, bar code readers, and RF triangulation (GPS), to name a few. Location may be obtained by operating an algorithm in the computer processor to matches the transport vehicle location to a predetermined path on the tracks.

In FIG. 6B, the vehicle is shown traversing through and negotiating a left turn. As the vehicle approaches the turn, frame 132, track electro-magnet 204 on the left turn bank is energized. Subsequent to the first truck of the vehicle making the initial turn, electro-magnet 205 is energized to continue the vehicle's path up the left branch line. Once the vehicle has completed its turn, electro-magnets 204, 205 are de-energized.

In FIG. 6C, the vehicle is shown traversing through and negotiating a right turn. As depicted in frame 136, an electro-magnet 207 on the right turn bank is energized to attract the vehicle to the right. Once the first truck of the vehicle has entered the turn, electro-magnet 209 is energized, as shown in frame 137, attracting the vehicle into the new track section. When the vehicle has completed its turn, electro-magnets 207, 209 are then de-energized.

In another embodiment, the vehicle may be levitated by an air cushion and controlled electro-magnetically about the track. The air cushion takes the place of the prior art electro-magnets used for levitation. The air cushion delivers an upward force to the transport vehicle adequate to lift the vehicle off the track sections. The vehicle continues to be steered and controlled by electro-magnets as described by the present invention. The air cushion may be supplied by air jets on or about the track sections that include controllable nozzles to aim air currents for lifting and propelling the transport vehicle along the track.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An apparatus for transporting a semiconductor wafer or lithographic reticles during processing, comprising:
    a plurality of track sections including a bottom surface and sidewalls, forming different routes within a process area, said routes including attachable turn sections, junction sections, and straight sections;
    a transport vehicle including a front steering truck adapted to travel on said plurality of track sections, main support wheels, and guide wheels;
    a plurality of computer controlled electro-magnets mounted on said front steering truck, said electro-magnets activated by said computer to propel said transport vehicle, initiate turns on said collection of track sections, and locate said vehicle;
    a plurality of permanent magnets mounted on said track sections' bottom surface and said sidewalls, where said permanent magnets on said bottom surface are separate magnets from said permanent magnets located on said sidewalls, said permanent magnets responsive to said electro-magnets when activated for steering said transport vehicle, such that said vehicle merges or diverges from one track section to another track section without coming in contact with said sidewalls of said track section; and
    air jets mounted to or within said plurality of track sections for supplying a cushion of air with force adequate to lift said transport vehicle off said plurality of track sections.

2. The apparatus of claim 1 wherein said air jets include controllable nozzles mounted on said plurality of track sections to aim air currents for lifting and propelling said transport vehicle along said track.

3. The apparatus of claim 1 further comprising having said electro-magnets mounted on said front steering truck at a left location, center location, and right location for initiating turns or traveling in a straight direction.

4. The apparatus of claim 1 wherein said junction section includes permanent magnets located on both of said sidewalls, at least one permanent magnet responsive to said electro-magnets on said vehicle to aid in turning said vehicle into said junction section and one permanent magnet responsive to said electro-magnets on said vehicle to aid in turning said vehicle out of said junction section.

5. An apparatus for transporting a semiconductor wafer or lithographic reticles during processing, comprising:

a plurality of track sections including a bottom surface and sidewalls, forming different routes within a process area, said routes including attachable turn sections, junction sections, and straight sections;

a transport vehicle including a front steering truck adapted to travel on said plurality of track sections, at least two trucks linked together by a support structure, including cross-links used to control the articulation of said at least two trucks as said transport vehicle negotiates a turn to prevent a jack-knife behavior;

a plurality of computer controlled electro-magnets mounted on said front steering truck, said electro-magnets activated by said computer to propel said transport vehicle, initiate turns on said collection of track sections, and locate said vehicle;

a plurality of permanent magnets mounted on said track sections' bottom surface and said sidewalls, where said permanent magnets on said bottom surface are separate magnets from said permanent magnets located on said sidewalls, said permanent magnets responsive to said electro-magnets when activated for steering said transport vehicle, such that said vehicle merges or diverges from one track section to another track section without coming in contact with said sidewalls of said track section; and air jets mounted to or within said plurality of track sections for supplying a cushion of air with force adequate to lift said transport vehicle off said plurality of track sections.

6. A method of steering a transport vehicle during semiconductor wafer or lithographic reticle processing, said method comprising:

propelling said transport vehicle over a plurality of track sections in a processing area using electro-magnets, and lifting said transport vehicle slightly above said tracks by providing an air cushion;

steering said transport vehicle, using electro-magnets in electromagnetic communication with permanent magnets, wherein magnets located on said vehicle are in said electromagnetic communication with magnets located on sidewalls of said plurality of track sections; and activating said electro-magnets using a computer processor, such that signals from said computer processor control said transport vehicle direction.

7. The method of claim 6 wherein steering said transport vehicle includes energizing said magnets mounted on said transport vehicle at a left location, center location, and right location for initiating turns or traveling in a straight direction, and using guide wheels on said vehicle in rotational communication with said sidewalls to keep said vehicle on said track.

8. The method of claim 7 further including mounting said electro-magnets on a front steering truck of said transport vehicle.

9. The method of claim 7 including mounting said permanent magnets on said plurality of track sections on portions of each bottom surface and sidewall.

10. The method of claim 7 further including mounting said electro-magnets on said plurality of track sections on portions of each bottom surface and sidewall.

11. The method of claim 7 including mounting said permanent magnets on a front steering truck of said transport vehicle.

12. The method of claim 6 including locating said transport vehicle on said tracks using said computer processor and said electro-magnets.

13. The method of claim 6 wherein propelling said transport vehicle includes applying electromotive or electromagnetic force to roll or slide said transport vehicle on said plurality of track sections.

14. A method of steering a transport vehicle during semiconductor wafer or lithographic reticle processing, said method comprising:

locating said transport vehicle on said tracks using said computer processor and electro-magnets, wherein said locating includes using said electromagnets as a Linear Variable Differential Transformer for sensing location;

propelling said transport vehicle over a plurality of track sections in a processing area using electro-magnets, and lifting said transport vehicle slightly above said tracks by providing an air cushion;

steering said transport vehicle, using electro-magnets in electromagnetic communication with permanent magnets, wherein magnets located on said vehicle are in said electromagnetic communication with magnets located on sidewalls of said plurality of track sections; and activating said electro-magnets using a computer processor, such that signals from said computer processor control said transport vehicle direction.

15. A method of steering a transport vehicle during semiconductor wafer or lithographic reticle processing, said method comprising:

propelling said transport vehicle over a plurality of track sections in a processing area using electro-magnets, and lifting said transport vehicle slightly above said tracks by providing an air cushion;

locating said transport vehicle on said tracks using Hall effect sensors, capacitive proximity sensors, infrared beam sensors, lasers, barcode readers, linear encoders, or RF triangulation (GPS);

steering said transport vehicle, using electro-magnets in electromagnetic communication with permanent magnets, wherein magnets located on said vehicle are in said electromagnetic communication with magnets located on sidewalls of said plurality of track sections; and activating said electro-magnets using a computer processor, such that signals from said computer processor control said transport vehicle direction.

16. A method of steering a transport vehicle during semiconductor wafer processing, said method comprising:

monitoring said transport vehicle location with a computer processor;

propelling said transport vehicle on a plurality of tracks using a first set of electro-magnets, steering said vehicle using guide wheels on said vehicle in rotational communication with track sidewalls in combination with a second set of electro-magnets, and lifting said transport vehicle slightly above said tracks by providing an air cushion; and determining when said transport vehicle should alter direction and activating electro-magnets on said transport vehicle to change direction, said electro-magnets in electromagnetic communication with permanent magnets on said tracks bottom surface and sidewalls.

17. The method of claim 16 wherein said step of determining when said transport vehicle should alter direction is performed by operating an algorithm in a computer processor that matches said transport vehicle location to a predetermined path on said tracks.

* * * * *